(12) United States Patent
Osada et al.

(10) Patent No.: US 6,258,628 B1
(45) Date of Patent: Jul. 10, 2001

(54) METHOD AND APPARATUS FOR PROCESSING RESIN SEALED LEAD FRAME

(75) Inventors: Michio Osada, Kyoto; Tetsuo Hidaka; Kazuo Horiuchi, both of Uji, all of (JP)

(73) Assignee: Towa Corporation, Kyoto (JP)

( * ) Notice: Subject to any disclaimer, the term of this patent is extended or adjusted under 35 U.S.C. 154(b) by 0 days.

(21) Appl. No.: 09/353,302

(22) Filed: Jul. 13, 1999

(30) Foreign Application Priority Data

Jul. 17, 1998 (JP) .................................................. 10-219613
Nov. 20, 1998 (JP) .................................................. 10-331117

(51) Int. Cl.⁷ ........................... H01L 21/44; H01L 21/48; H01L 21/50
(52) U.S. Cl. .......................... 438/111; 438/113; 438/123; 438/124; 438/127; 438/907; 438/908
(58) Field of Search .................................... 438/111, 113, 438/123, 124, 127, 907, 908

(56) References Cited

U.S. PATENT DOCUMENTS 5,332,405 * 7/1994 Golomb .............................. 29/25.01
5,361,486 * 11/1994 Harmsen et al. ...................... 29/563

FOREIGN PATENT DOCUMENTS 5-169397   6/1993 (JP) .
209188   10/1981 (TW) .

* cited by examiner

Primary Examiner—John F. Niebling
Assistant Examiner—David A. Zarneke
(74) Attorney, Agent, or Firm—W. F. Fasse; W. G. Fasse

(57) ABSTRACT

Resin sealed lead frames are processed by modular processing work stations related in number to a plurality of steps used in processing the lead or leads of the resin sealed lead frame. The work stations are separate modules which are detachably interconnected, whereby the number of modules can be exactly correlated to the number of steps actually required for processing the lead or leads of the resin sealed lead frame. As required, modules can be added or omitted. The resin sealed lead frame is sequentially advanced through the modules in steps corresponding to at least two pitches, whereby one pitch is defined as the on-center spacing between two neighboring products on the lead frame. Such feed advance permits performing at least two processing steps simultaneously. Thus, the method for processing the resin sealed lead frame and the apparatus therefore are adaptable to a change in the type of processing and to the production volume.

8 Claims, 12 Drawing Sheets

FIG. 5A
FIG. 5B
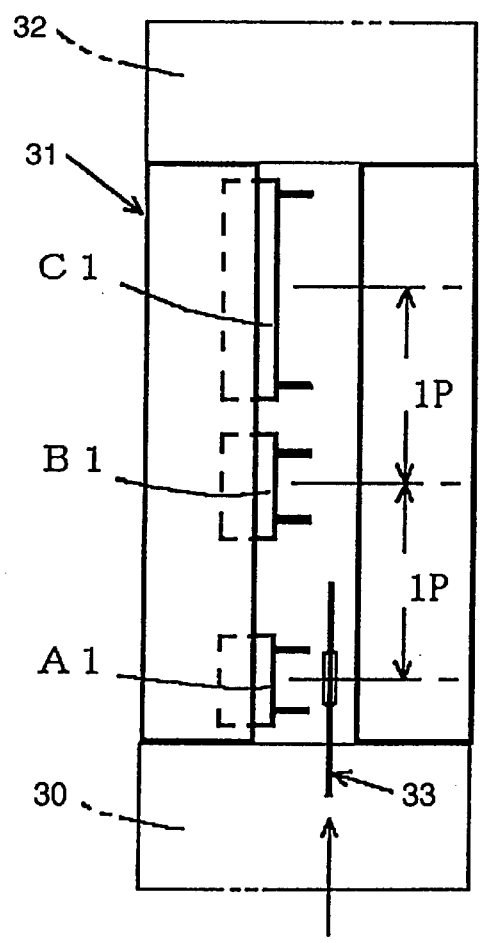
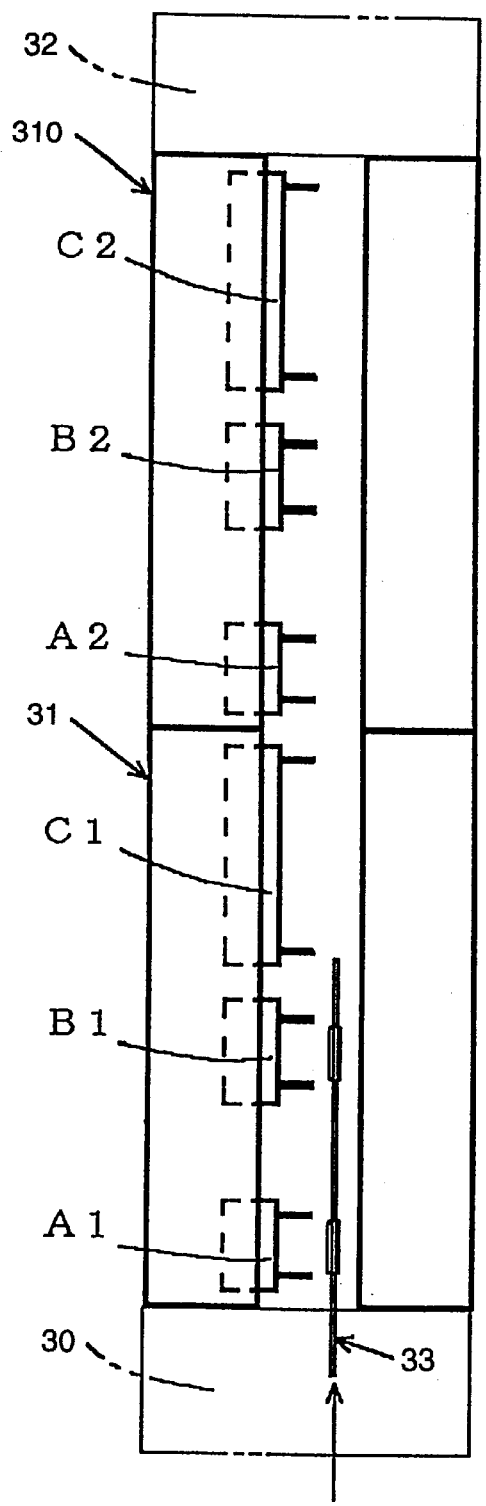

(a) (b) (c) (d)

FIG. 10A
FIG. 10B
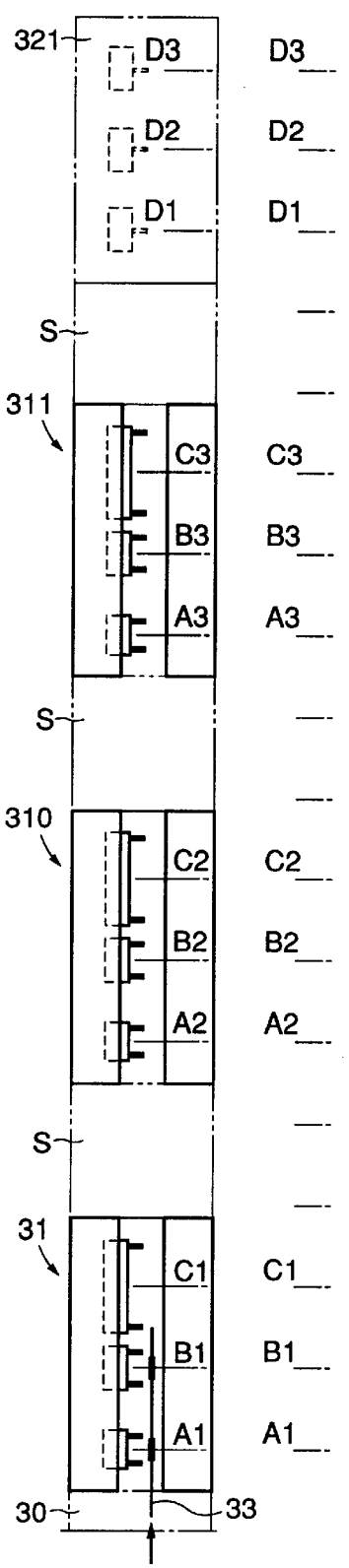
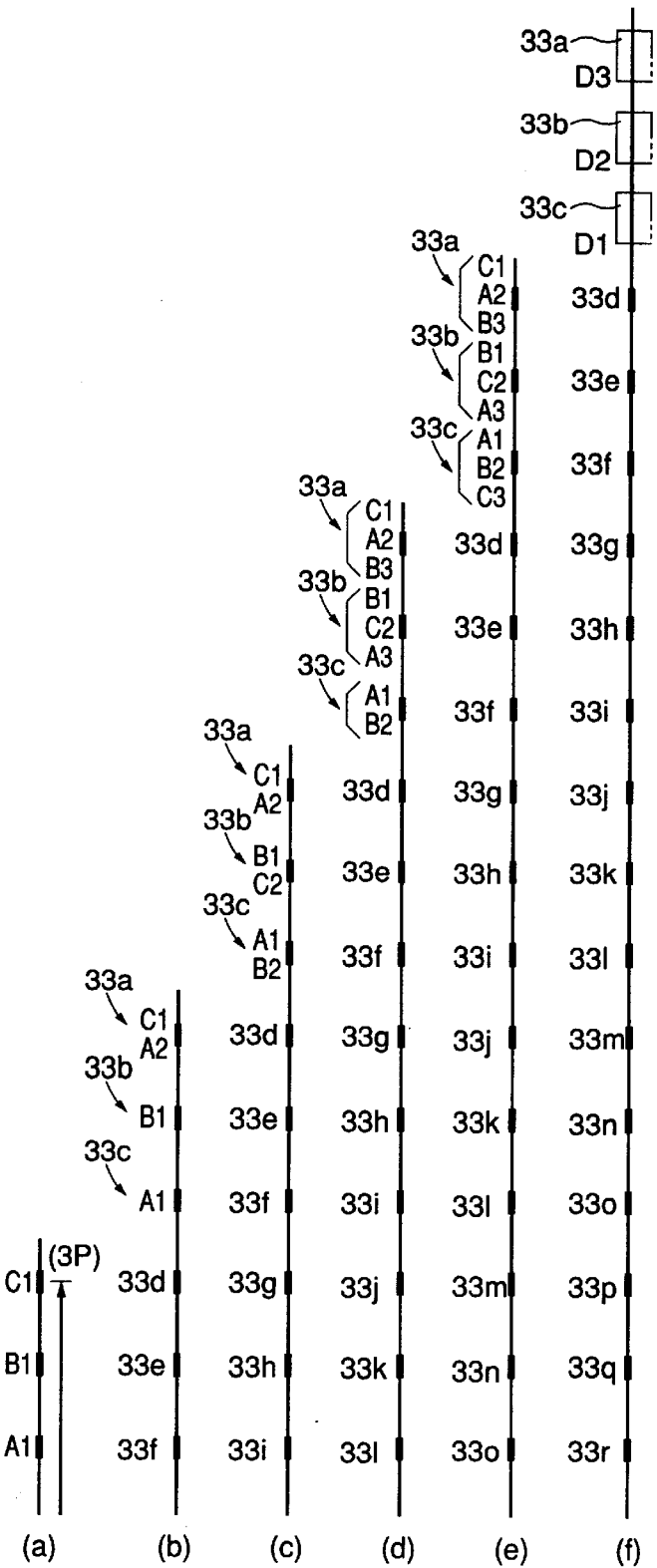

FIG. 13A
PRIOR ART
FIG. 13B
PRIOR ART
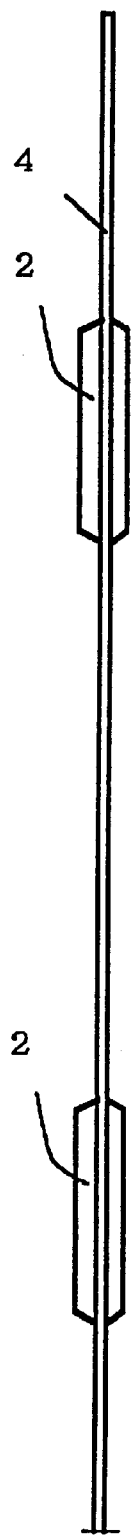
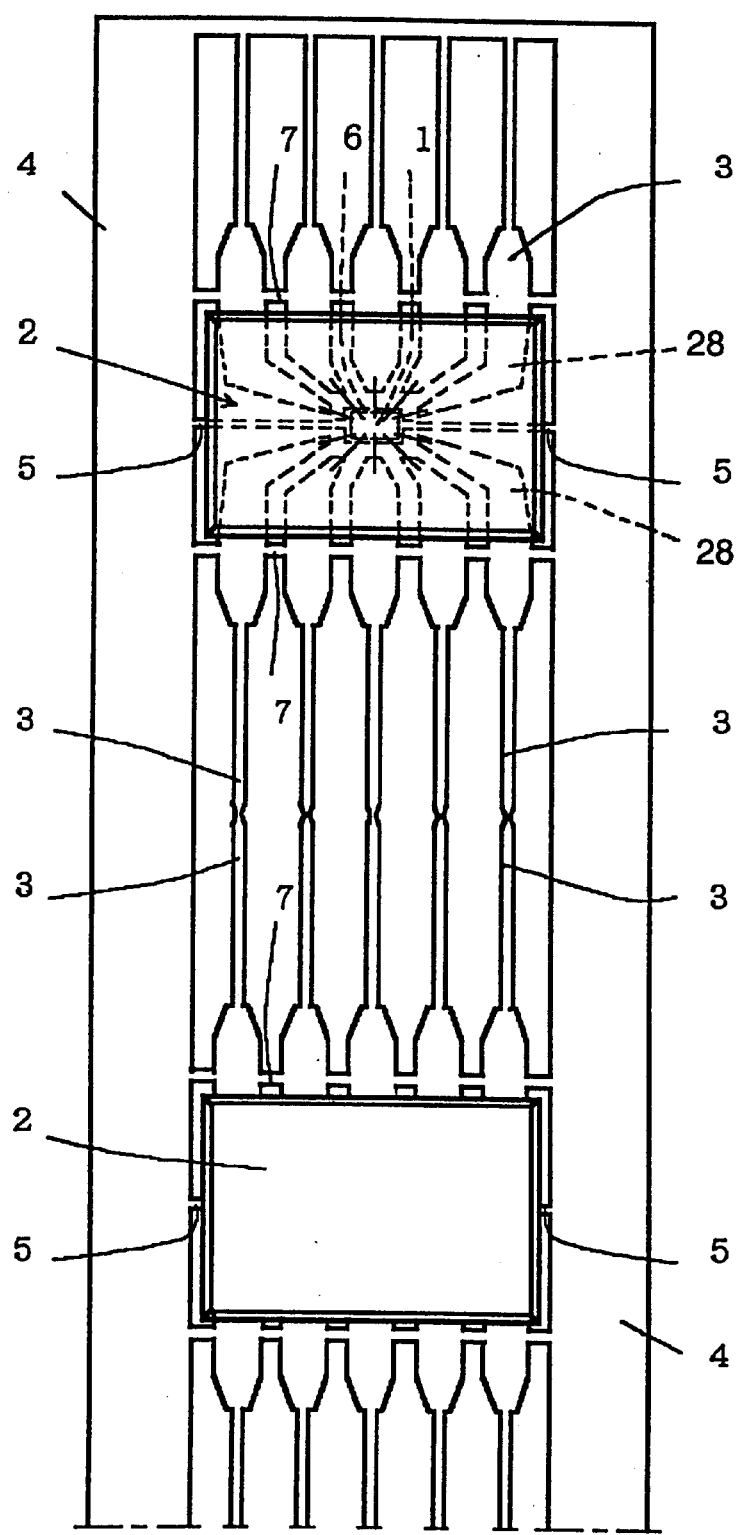

METHOD AND APPARATUS FOR PROCESSING RESIN SEALED LEAD FRAME

BACKGROUND OF THE INVENTION

1. Field of the Invention

The present invention relates to methods of processing lead frames in which an electronic part such as an IC (Integrated Circuit) is sealed with resin, hereinafter simply referred to as a resin sealed lead frame, and apparatuses therefor. More specifically, the present invention relates to a method of processing resin sealed lead frames for cutting a prescribed portion of the resin sealed lead frame or separating each electronic section forming a product, on the resin sealed lead frame and an improvement of the apparatus for performing the method.

2. Description of the Background Art

A first type of prior art related to the present invention will now be described with reference to FIGS. 11 and 12A to 12C. FIG. 11 generally shows a processing apparatus for a resin sealed lead frame according to the first type of prior art. FIGS. 12A to 12C schematically show an arrangement of a so-called QFP (Quad Flat Package) type resin sealed lead frame A in which outer leads 3 protrude from four sides of a resin sealed molding or mold package 2 in which an electronic part 1 is sealed.

In a resin sealed lead frame A shown in FIGS. 12A to 12C, a lead frame body 4 and a die pad 6 for mounting an electronic part 1 are connected by a pinch lead 5. A dam bar 7 is provided for preventing melted resin material from flowing out of a mold cavity at the time of sealing the electronic part 1 with resin. A cavity 8 serves as a resin pool. Four electronic parts 1 are mounted to the lead frame body 4 and each part 1 is electrically connected to a prescribed outer lead.

For separating each electronic section or product from the resin sealed lead frame A, for example, various cutting steps, such as cutting of the cavity 8, cutting of the resin at the dam bar 7, cutting of the dam bar 7 itself, cutting of a tip connecting portion of the outer lead 3 and cutting of the pinch lead 5, must be performed.

A plurality of such cutting steps, for example, the above mentioned resin cutting step and the dam bar cutting step can be performed almost simultaneously, depending on the thickness, shape or the like of the lead frame body 4. At the same time, any unnecessary step should be eliminated. The above mentioned separation of each electronic section is performed by a lead processing apparatus having an upper mold or tool 9 and a lower mold or tool 10, for example as shown in FIG. 11.

The lead processing apparatus illustrated in FIG. 11 is structured to perform only the above mentioned cavity cutting step, the dam bar cutting step and the pinch lead cutting step. More specifically, the lead processing apparatus shown in FIG. 11 is provided with a structure of a so-called sequentially feeding mold and includes: an upper mold base 11; a punch holder 12 fixed to the upper mold base 11; a punch blade 13 fixed to the punch holder 12; a stripper blade 14 suspended from the punch blade 13, a cavity cutting punch 15 for cutting the cavity 8; a dam bar cutting punch 16 for cutting the resin at the dam bar 7; and a pinch lead cutting punch 17 for cutting the pinch lead 5.

Base portions of punches 15, 16 and 17 are fixed to the same punch holder 12 through the punch blade 13, and their tip blades are fitted onto a punch guide 18. Dies 19, 20 and 21 are arranged on the lower mold 10, respectively corresponding to punches 15, 16 and 17.

As shown in FIG. 11, the resin sealed lead frame A is fed to a prescribed position between the upper and lower molds 9 and 10, and the cutting steps are sequentially performed by the punches 15, 16, 17, and the dies 19, 20, 21 while sequentially feeding each electronic section on the resin sealed lead frame A. Thus, each electronic section is sequentially separated.

As described above, in the conventional lead processing apparatus, each punch used for cutting and separating the electronic sections or product from the resin sealed lead frame A, is integrally fixed to one mold base, and the die corresponding to the punch is integrally fixed to the other mold base.

When the leads of a different type of resin sealed lead frame are to be processed, the above described conventional lead processing apparatus cannot be directly used. Then, a different lead processing apparatus for the resin sealed lead frame must be provided, or any unnecessary punches and dies fixed to the mold base 11 must be removed so that different punches and different dies required for the lead processing can be integrally fixed to the mold base.

Providing a dedicated separate lead processing apparatus for every kind of resin sealed lead frame is very uneconomical, and changing of the punches and dies for every kind of resin sealed lead frame requires not only a laborious operation but also skill for the fine adjusting after the tool and die change.

A second type of prior art related to the present invention will now be described with reference to FIGS. 13A and 13B. It is noted that elements corresponding to those of the above described first type of prior art shown in FIGS. 12A to 12C are denoted by the same reference numerals. FIGS. 13A and 13B schematically show an exemplary arrangement of a resin sealed lead frame in which outer leads 3 protrude from two sides of a resin sealed molding 2 including an electronic part 1.

In the resin sealed lead frame according to the second type of prior art shown in FIGS. 13A and 13B, a cradle 4 and a die pad 6 for mounting the electronic part 1 are connected by a pinch lead 5. A dam bar 7 is further provided to prevent melted resin from flowing out of a mold cavity at the time of sealing the electronic part 1 with resin. A prescribed number of electronic parts 1 are mounted on a cradle 4 and each part is electrically connected to a prescribed inner lead 28.

For the step of separating each electronic section or product from the resin sealed lead frame, a lead processing apparatus having a so-called sequentially feeding mold is used. The sequentially feeding mold includes a punch and die for cutting and thereby performs each cutting step while sequentially feeding the resin sealed lead frame to a prescribed position between the punch and die. For example, the mold sequentially performs cutting of resin and removal of resin at the dam bar 7, cutting of the dam bar 7, cutting of a tip connecting portion of an outer lead 3, and cutting of the pinch lead 5 or the like.

It is noted that if a mold for bending the outer lead 3 is provided along with the above described mold for cutting, a step of bending the outer lead can be simultaneously or separately performed. However, as the bending of the lead is performed in a manner substantially similar to that of the above mentioned cutting steps, a further description thereof is not necessary.

In the conventional method of processing the lead or leads described with reference to FIGS. 13A and 13B, the products are pressed by cutting molds which are spaced by one pitch along the feeding path while sequentially feeding the products on the lead frame by a distance equal to one pitch. One pitch is defined as the on-center spacing between two neighboring products along the feeding path. In the final processing step, each product is sequentially cut and separated from the resin sealed lead frame to produce separate products. For increasing the production volume per period of time, the number of lead processing apparatuses having similar functions and structures must be increased. For example, to double the production volume in the same period of time, two lead processing apparatuses having similar structures must be provided, whereby the equipment costs, and the required space for the equipment is doubled.

SUMMARY OF THE INVENTION

An object of the present invention is to provide a method for processing a resin sealed lead frame capable of accommodating a change in the processing operation and a change in the production volume for processing the resin sealed lead frames and an apparatus for performing such a change accommodating method.

The method of processing resin sealed lead frames according to the invention has achieved the above described objects by the combination of the following steps:

(a) preparing said resin sealed lead frames with products (2) on said resin sealed lead frames (4) having a spacing corresponding to a first pitch (P) defined as an on-center distance between neighboring products (2) on said resin sealed lead frames (4), (b) assembling a second number n of processing tool modules (100, 101, . . . ) for each of said first number N of processing operations, in series along a processing feed advance path, so that a total number M of processing tool modules corresponds to M=N·n for performing said operations on said resin sealed lead frames, and (c) sequentially feeding said resin sealed lead frames with said products on said resin sealed lead frames (4) along said processing feed advance path in steps having a step length corresponding to a second pitch (P') that is equal in length to said second number n times said first pitch (P), thus P'=n·P, and wherein said second number n is at least equal to two for simultaneously processing at least two of said products on said resin sealed lead frames.

A processing apparatus according to the present invention for performing the above described first embodiment of the present method is characterized in that the processing means corresponding to the plurality of processing steps are separate modules which are detachably connected to a base.

According to the present invention, the processing apparatus is easily modified by combining separate, detachable modules selected with regard to which processing steps are to be performed. Thus, the present apparatus can be simply and promptly restructured by suitably connecting or disconnecting the modules as necessary.

Therefore, a dedicated lead processing apparatus does not need to be prepared for every kind of the resin sealed lead frame, and the operation of changing punches and dies, fine adjusting operation after the change or the like have been eliminated. As a result, the apparatus can simply cope with a change in the processing operation for processing the lead of the resin sealed lead frame, whereby the productivity for making various products considerably increases.

According to the present invention, since the dedicated lead processing apparatus does not need to be prepared for every kind of the resin sealed lead frame, an economic advantage is achieved. The number of modules can be increased or decreased depending on the actual lead processing operation, other operation conditions or the like. In addition, the processing means for the unnecessary steps can be eliminated from the lead processing apparatus, so that an overall reduction in the equipment cost can effectively be achieved.

According to another aspect, a method of processing a resin sealed lead frame according to the present invention relates to a processing method using a processing apparatus for the resin sealed lead frame including: a feeding portion for the resin sealed lead frame before the lead processing, provided along a feeding path of the resin sealed lead frame; a lead processing portion for the resin sealed lead frame connected to the feeding portion; and a removing portion for the resin sealed lead frame after the lead processing wherein the removing portion is detachably connected to the lead processing portion. In the processing method, the resin sealed lead frame is sequentially fed by a plurality of pitches or at least two pitches, whereby one pitch is the on-center spacing between two neighboring products on the resin sealed lead frame and the apparatus comprises a plurality of lead processing basic units having the same lead processing function detachably connected in series in the lead processing portion. A prescribed lead processing is performed for the products by the plurality of lead processing basic units in the lead processing portion at prescribed positions spaced by a plurality of pitches of the resin sealed lead frame. Subsequently, the resin sealed lead frame is removed from the removing portion.

In the method for processing the resin sealed lead frame, a step of cutting and separating the products on the resin sealed lead frame is further provided before removal of the resin sealed lead frame from the removing portion of the apparatus.

The processing apparatus for performing the above described processing method according to the second aspect includes: a feeding portion (30) for the resin sealed lead frame before lead processing which is provided along a feeding path of the resin sealed lead frame; a lead processing portion for the resin sealed lead frame detachably connected to the feeding portion; and a removing portion for the resin sealed lead frames after the lead processing, whereby the removing portion is detachable connected to the lead processing portion. The lead processing portion includes a plurality of lead processing basic units which have the same lead processing function and are detachably connected in series.

Thus, the present invention effectively provides a processing method and apparatus for resin sealed lead frames capable of simply and promptly accommodating a change in the production volume.

A lead processing apparatus provided with one lead processing basic unit as the lead processing portion or a plurality of (two or more) lead processing basic units can be selected and employed as required. When the structure including at least two lead processing units as the lead processing portions is selected and employed, the production volume can be increased multiple times, corresponding to the number of the lead processing basic units.

Further, when at least two lead processing basic units are provided as the lead processing portions, the feeding portion for the resin sealed lead frame upstream of the lead processing and for the removing portion for the resin sealed lead frame downstream of the lead processing, may be the same. Therefore, as compared with the case where at least two lead processing apparatuses having full functions and structures are separately provided, an overall reduction in the overall equipment cost and space for the lead processing apparatus has been achieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 5A and 5B are schematic diagrams generally showing a processing apparatus for a resin sealed lead frame according to a third embodiment of the present invention, where FIG. 5A shows a basic structure thereof and FIG. 5B shows another lead processing portion having the same function added to the basic structure shown in FIG. 5A.

FIG. 10A is a schematic diagram generally showing a lead processing apparatus according to a fifth embodiment of the present invention, and FIG. 10B is a diagram showing the steps and respective function thereof.

FIG. 13A is a front view schematically showing a resin sealed lead frame according to the second type of prior art, and FIG. 13B is a plan view schematically showing the conventional lead frame.

DESCRIPTION OF THE PREFERRED EMBODIMENTS

First Embodiment

Now, a first embodiment of the present invention will be described in detail with reference to FIGS. 1 and 2A to 2D.

Figure 1:
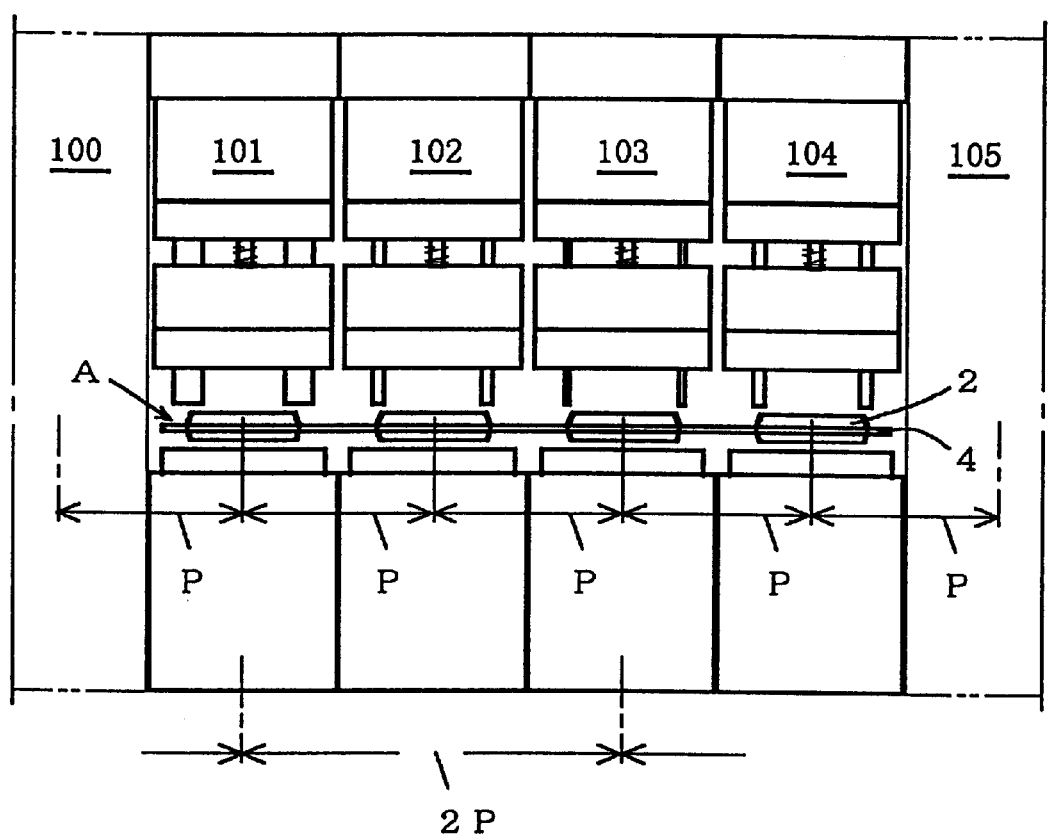
FIG. 1 is a schematic front view generally showing a processing apparatus for a resin sealed lead frame according to a first embodiment of the present invention.

Referring to FIG. 1, the processing means for performing a plurality of processing steps required for finishing the leads of resin sealed lead frames are separately provided as modules in the present apparatus. The separate modules are detachable and can suitably be connected to or disconnected from the apparatus as necessary. Thus, a structure of the processing apparatus provided with a desired lead processing portion can be employed.

More specifically, the above described processing apparatus includes: a feeding portion including a feeding module 100 for the resin sealed lead frame A, a cavity cutter module 101 connected to the feeding portion 100; a resin cutter module 102 connected to cavity cutter module 101; a dam bar cutter module 103 connected to the resin cutter module 102; a pinch lead cutter module 104 connected to dam bar cutter module 103; and a receiving portion also formed as a module for receiving a product 105 connected to the pinch lead cutter module 104. All modules are integrally connected in series with each other.

The feeding portion 100, the modules 101 to 104 and the receiving portion 105 are detachable from the apparatus.

Pitches P between any two of feeding portion 100, modules 101 to 104 and receiving portion 105 which are integrally connected in series are all equal to one another. Thus, modules 101 to 104 form the processing apparatus which includes only processing means which are necessary for performing the desired steps by selecting only necessary modules and suitably connecting or disconnecting the same depending on a thickness, shape or the like of a lead frame body 4.

As modules 101 to 104 can be suitably combined depending on the actual requirements of the operation for processing the lead of the resin sealed lead frame, the apparatus is advantageously adjustable to any specific operation. In addition, any processing means for unnecessary steps can be removed from the apparatus, so that a reduction in the overall equipment cost can be achieved.

It is noted that the cutting process for the resin sealed lead frame A is very difficult when pitches P for the products on the resin sealed lead frame A and hence pitches P for modules 101 to 104 are narrow. Then, as indicated by a reference character 2P in FIG. 1, the above described pitch P may be, for example, doubled to have two pitches. In this case, the resin sealed lead frame A may be sequentially fed or stepped by two pitches and the cutting process for the resin sealed lead frame A may be performed by each module corresponding to the sequentially advanced position.

Provided in the above described feeding portion 100 for resin sealed lead frame A is a portion of a magazine holding a plurality of resin sealed lead frames A. The magazine holding the resin sealed lead frames A is transported to a prescribed position in the cavity cutter module 101 connected to the feeding portion 100 by a suitable transporting mechanism such as an engageable chuck not shown.

Figure 2A:
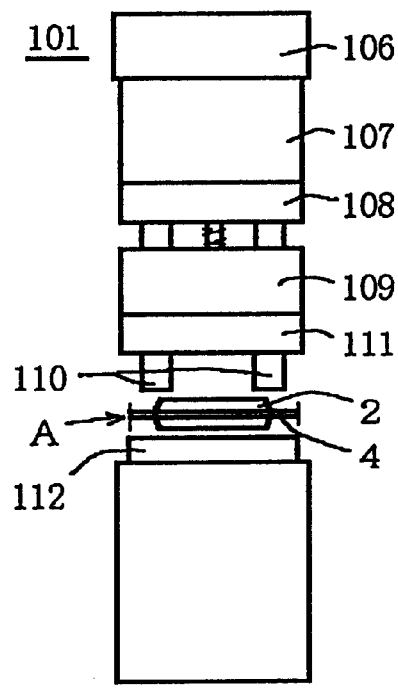
FIGS. 2A to 2D are schematic front views showing modules of the processing apparatus for the resin sealed lead frame shown in FIG. 1, respectively corresponding to a cavity cutter, a resin cutter, a dam bar cutter and a pinch lead cutter module.

Referring to FIG. 2A, cavity cutter module 101 includes: an upper mold base 102; a punch holder 107 fixed to the upper mold base 106; a punch blade 108 fixed to the punch holder 107; a stripper blade 109 suspended from the punch blade 108; a cavity cutter punch 110 for cutting at least one cavity 8 of the resin sealed lead frame; a punch guide 111 for mounting a tip blade of the punch 110; and a die 112 positioned on the side of the lower mold corresponding to punch 110. A cavity 8 permits the flow of resin where needed.

Figure 12A:
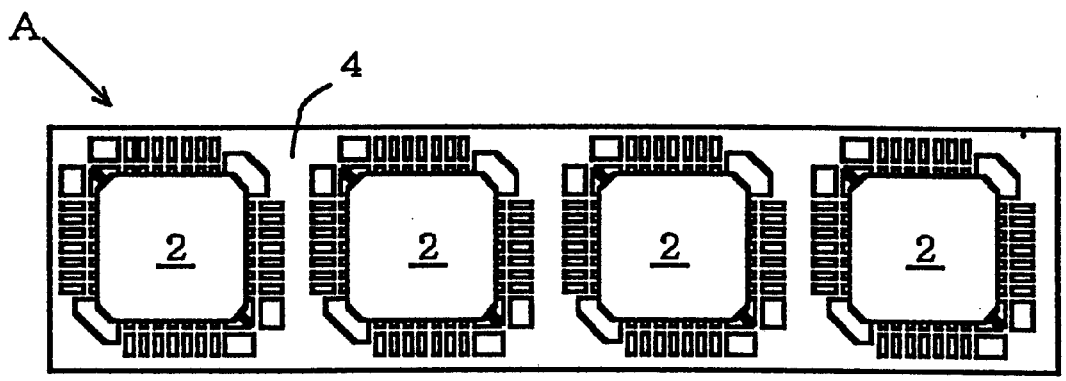
FIG. 12A is a plan view schematically showing the resin sealed lead frame according to the first type of prior art.
Figure 12B:
FIG. 12B is a front view.
Figure 12C:
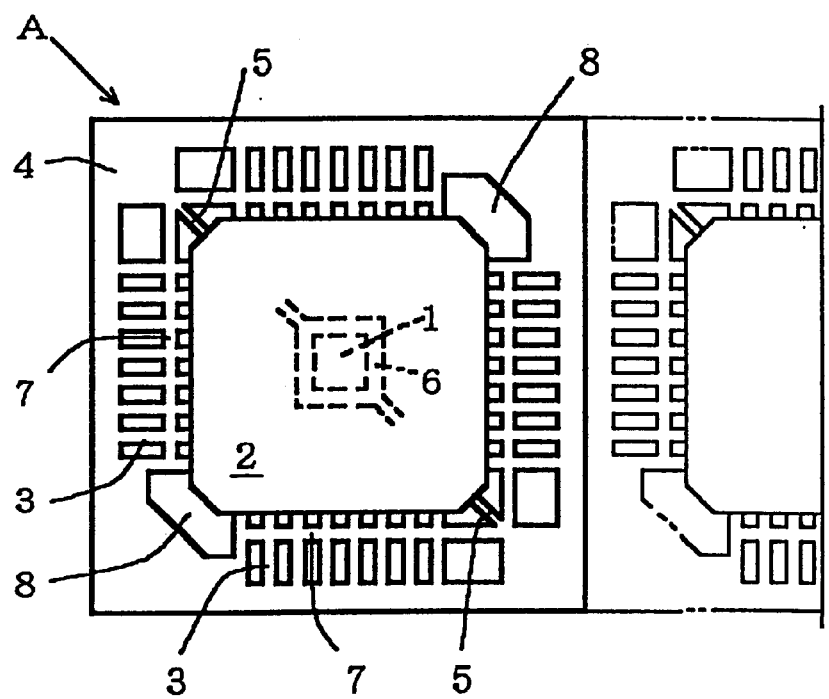
FIG. 12C is a plan view schematically showing an enlarged view of a part of the conventional resin sealed lead frame.

Cavity cutter punches 110 are arranged corresponding to the number and positions of cavities 8 in each product on the resin sealed lead frame A. For example, two cavities 8 are formed in one product on the resin sealed lead frame A shown in FIGS. 12A to 12C, so that a total of two cavity punches 110 are provided.

Thus, cavities 8 for the resin sealed lead frame A which have been transported to a prescribed position in the cavity cutter module 101 by the above described transporting mechanism, are simultaneously cut or punched by the cutter punch 110 and the die 112 at the time of clamping the upper and lower molds together.

The resin sealed lead frame A which has been subjected to the cavity cutting step is transported to a prescribed position in a resin cutter module 102 connected to the cavity cutter module 101 by the above mentioned transporting mechanism.

Figure 2B:
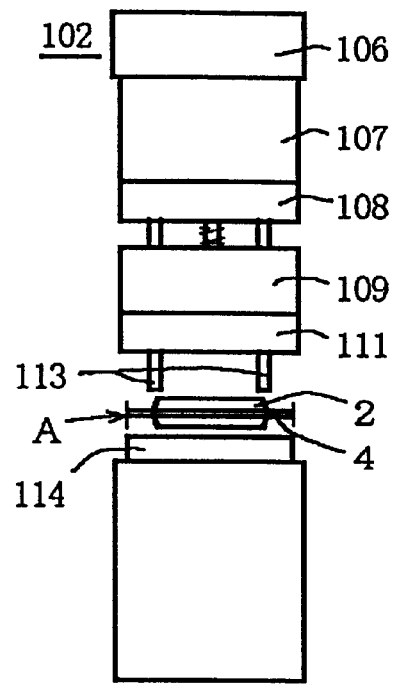

Referring to FIG. 2B, the resin cutter module 102 is provided with substantially the same structure as that of cavity cutter module 101 except for the resin cutter punch 113 and the die 114 for cutting the resin at the dam bar 7 of the resin sealed lead frame A. Therefore, the elements which are substantially the same as those of the cavity cutter module 101 are denoted by the same reference numerals in FIG. 2B.

The resin at the dams in the resin sealed lead frame A which has been transported to a prescribed position in the resin cutter module 102 by the above mentioned transporting mechanism is simultaneously cut by the resin cutter punch 113 and the die 114 at the time of clamping of the upper and lower molds together.

After the resin cutting step the resin sealed lead frame A is transported to a prescribed position in dam bar cutter module 103 connected to the resin cutter module 102 by the transporting mechanism.

Figure 2C:
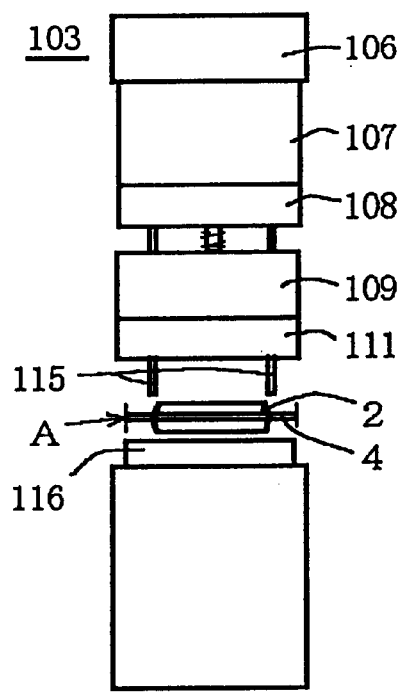

Referring to FIG. 2C, the dam bar cutting module 103 has a structure which is substantially the same as that of each of the above described modules except for a dam bar cutter punch 115 and a die 116 for cutting the dam bar 7. Therefore, the elements which are substantially the same as those of the above described modules are denoted in FIG. 2C by the same reference numerals.

The dam bars 7 of the resin sealed lead frame A which has been transported to a prescribed position in dam bar cutter module 103 by the transporting mechanism, are simultaneously cut by dam bar cutter punch 115 and the die 116 at the time of clamping of the upper and lower molds together.

After the dam bar cutting step the resin sealed lead frame A is transported to a prescribed position in the pinch lead cutter module 104 connected to the dam bar cutter module 103 by the above mentioned transporting mechanism.

Figure 2D:
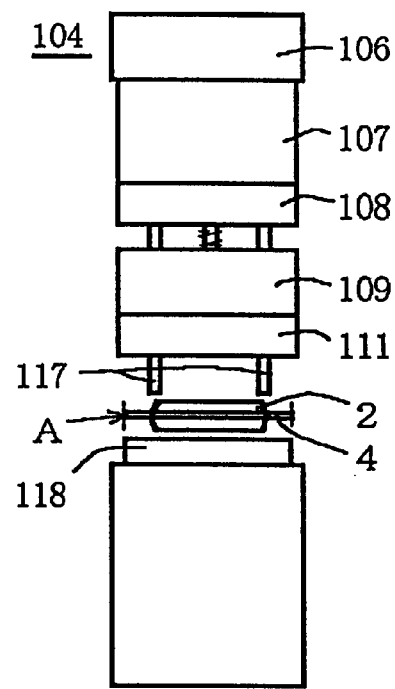

Referring to FIG. 2D, the pinch lead cutter module 104 has a structure which is substantially the same as that of each of the above described modules except for a pinch lead cutter punch 117 and a die 118 for cutting the pinch lead 5 in the resin sealed lead frame A. Therefore, the elements which are substantially the same as those of the above described modules are denoted in FIG. 2D by the same reference numerals.

The pinch leads 5 of the resin sealed lead frame A which has been transported to a prescribed position in the pinch lead cutter module 104 by the above mentioned transporting mechanism, are simultaneously cut by the pinch lead cutter punch 117 and the die 118 at the time of clamping of the upper and lower molds together.

Each product which has been cut and separated from the resin sealed lead frame A by the above described pinch lead cutting step is transported to a receiving portion also referred to as receiving module for each product 105 connected to pinch lead cutting module 104.

In operation the resin sealed lead frame A is sequentially fed or stepped by the transporting mechanism to a prescribed position between the upper and lower molds in each of the modules 101 to 104 from the feeding portion 100 for sequentially performing the cutting steps by the punches 110, 113, 115, 117 and the dies 112, 114, 116, 118. As described above, the separated product is transported toward the receiving portion 105 by the transporting mechanism.

It is noted that as the pitches P for the feeding portion 100, for the modules 101 to 104 and for the receiving portion 105 which are integrally connected in series are all equal to one another, a process similar to that described above can be performed for a resin sealed lead frame having such an equal pitch P.

When any of the steps performed by the modules 101 to 104 is not necessary depending on the state of the actual operation for processing the leads of the resin sealed lead frame, and depending on the other operation conditions or the like, the module related to the unnecessary step may be removed. Conversely, if any additional processing step is required, a module related to the additional step may be added to the apparatus.

Now, a second embodiment of the present invention will be described with reference to FIGS. 3 and 4.

In the above described first embodiment, one product on the resin sealed lead frame A is sequentially processed by each of the modules 101 to 104. In the second embodiment, a plurality of products on the resin sealed lead frame are simultaneously processed by each of the modules. For example, in FIG. 3, the resin sealed lead frame A carries four products. FIG. 3 also shows an exemplary structure of a cavity cutter module 201 for simultaneously cutting cavities for four products.

More specifically, the structure of the cavity cutter module 201 is substantially the same as that of the cavity cutter module 101 according to the first embodiment, except that the cavity cutter punch 210 and the die 212 are provided for cutting the flow cavities of four products. In the present embodiment, an upper mold base 206, a punch holder 207, a punch blade 208, a stripper blade 209 and a punch guide 211 are also provided.

As in the cavity cutter module 201, a punch and a die for processing the above described four products is provided in each of the other modules.

The pitch P between the cavity cutter punch 210 and the die 212 arranged in cavity cutter module 201 and the pitch P for the products on the resin sealed lead frame A are all equal. In the second embodiment shown in FIGS. 3 and 4, as in the case of the first embodiment shown in FIGS. 1 and 2, the modules are detachable and can be suitably connected or disconnected as necessary as shown in FIG. 4, so that a processing apparatus provided with processing means related to desired steps, is obtained.

Figure 3:
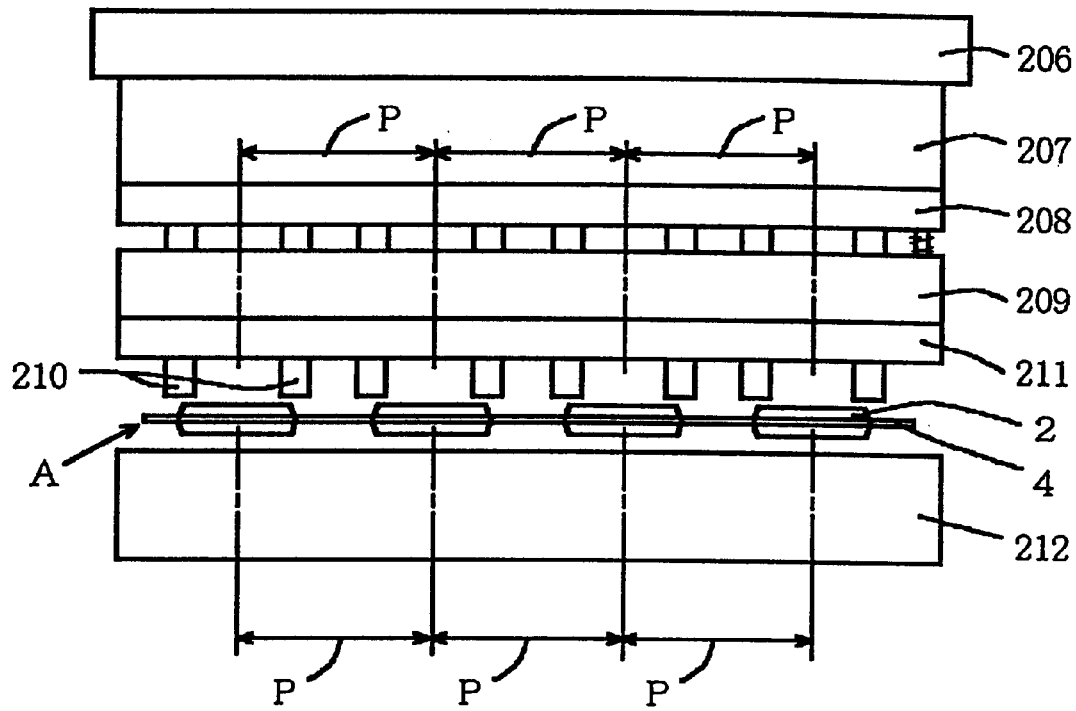
FIG. 3 is a schematic front view generally showing a structure of a cavity cut module according to a second embodiment of the present invention.
Figure 4:
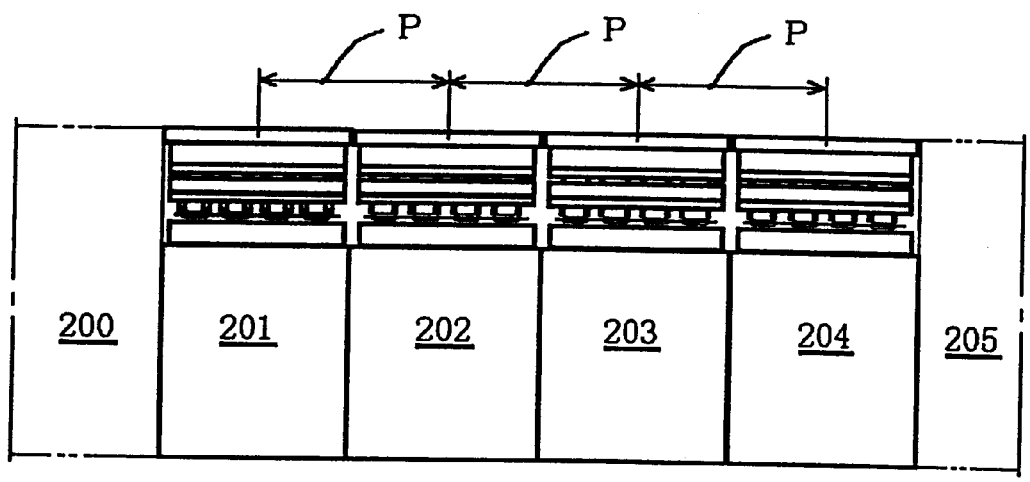
FIG. 4 is a schematic front view generally showing a processing apparatus for the resin sealed lead frame according to the second embodiment of the present invention, where the cavity cutter module corresponding to FIG. 3 is connected to the other modules.

As in the above described first embodiment, the second embodiment shown in FIGS. 3 and 4 also includes a feeding portion 200 for the resin sealed lead frames A, the cavity cutter module 201, the resin cutter module 202, the dam bar cutter module 203, the pinch lead cutter module 204 and the receiving portion 205 for each product.

In operation of the second embodiment, the resin sealed lead frames A are transported from the feeding portion 101 to the cavity cutter module 201 by a suitable transporting mechanism, for simultaneously cutting flow cavities for four products.

As in the cavity cutting step, the resin sealed lead frames A are sequentially transported to a prescribed position between the upper and lower molds in each of the modules 202 to 204 connected to the cavity cutter module 201 for simultaneously performing the respective cutting step by the punch and die for the above mentioned four products.

As described above, each of the separated products needs only to be transported to the receiving portion 205 by the transporting mechanism.

It is noted that the pitch P between the punch and the die in each of modules 201 to 204 and the pitch P of the products on the resin sealed lead frame A are equal to each other, whereby the step of transporting the resin sealed lead frame A to each of the modules 201 to 204 can be accurately and surely performed by the transporting mechanism.

In the above described embodiments, only the step of cutting and separating each product from the resin sealed lead frame is described as the step required for processing the leads. However, a so-called forming step for bending and forming an outer lead of each product in a prescribed shape may be included as a step required for processing each lead.

Thus, as in the case of each of the modules 101 to 104 and 201 to 204, the processing means related to the step required for lead forming is provided as a separate module and which is detachably connected to the pinch lead cutter module 104, 204 or the like. The separate module performs the final step. The product which has been cut and separated is transported to a forming module by a suitable transporting mechanism. In this case, not only the step of cutting and separating each product from the resin sealed lead frame is performed, but also lead forming of each product can be automatically performed sequentially after the last cutting step, so that a practical advantage is obtained.

A third embodiment of the present invention will now be described in detail with reference to FIGS. 5A to 8B.

Figure 6A:
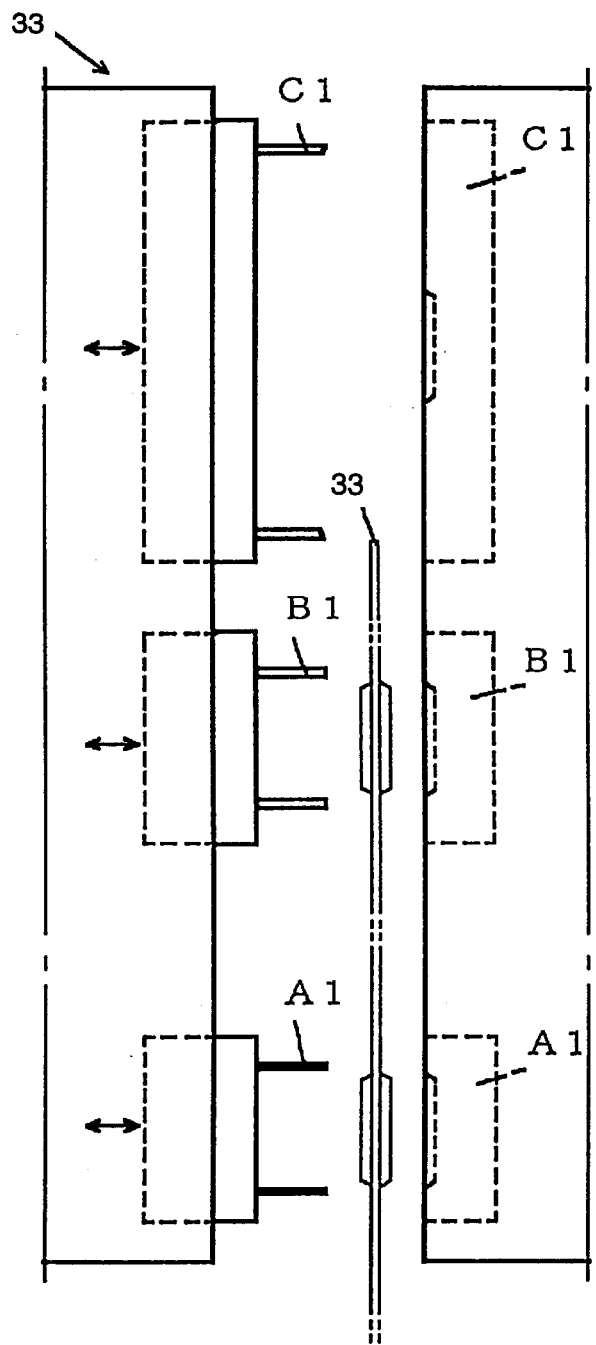
FIG. 6A is a front view schematically showing an enlargement of a main portion of a lead processing section of the lead processing apparatus shown in FIGS. 5A and 5B.

Referring to FIG. 5A and 6A, a processing apparatus according to the present embodiment includes as a basic structure thereof: a feeding portion 30 for a resin sealed lead frame before lead processing; one lead processing basic unit 31 connected to the feeding portion 30 as a lead processing portion for the resin sealed lead frame; and a removing portion 32 for removing the resin sealed lead frame connected to the lead processing basic unit 31 after completion of the lead processing.

It is noted that the feeding portion 30 in the above described basic structure sequentially feeds resin sealed lead frame 33 along a feeding path by one pitch by a suitably provided feeding mechanism, not shown.

The lead processing basic unit 31 is provided with a mold including a required punch and a die for cutting spaced by a distance of one pitch equal to an on-center pitch between the neighboring products on the resin sealed lead frame 33.

Figure 6B:
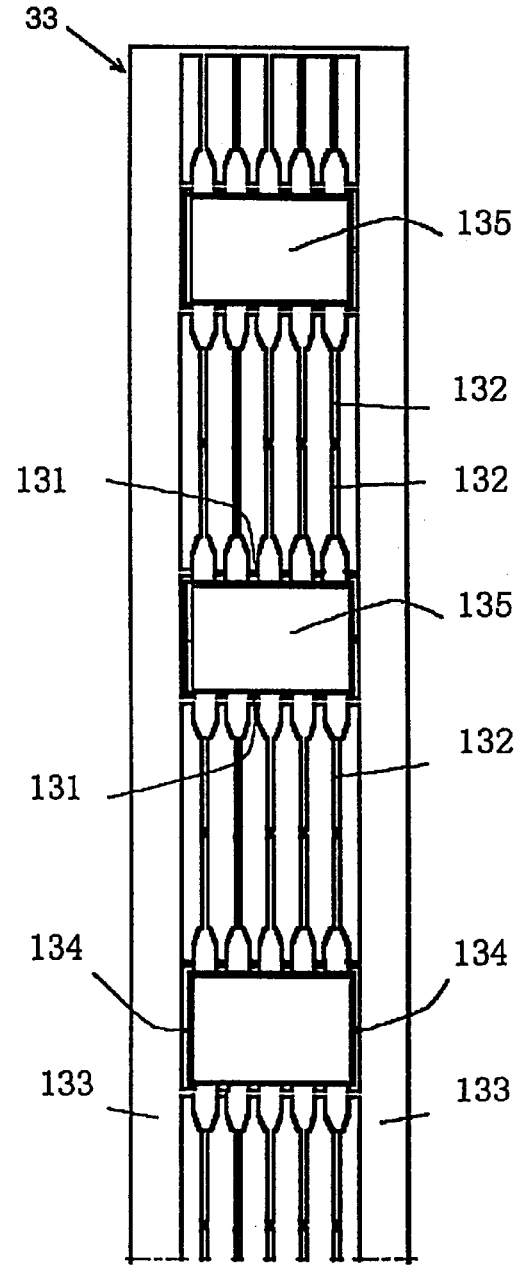
FIG. 6B is a plan view schematically showing an enlargement of a main portion of the resin sealed lead frame of the apparatus.

In the illustrated exemplary structure, provided along the feeding path of the lead frame are: a punch and die for a resin cutter A1 for cutting the resin at the dam bar 131 of the resin sealed lead frame 33 as shown in FIG. 6B; a punch and die for a dam bar cutter B1 for cutting the dam bar 131; and a punch and die for a lead cutter C1 for cutting a connecting tip portion of an outer lead 132.

Referring to FIG. 6B, the resin sealed lead frame according to the present invention includes: a cradle 133; a pinch lead 134 connecting the cradle 133 and a die pad for mounting an electronic part; and a resin sealed molding 135 of the electronic part. The resin sealed lead frame has substantially the same shape and structure as those of the resin sealed lead frame shown in FIGS. 13A and 13B.

Further, resin sealed lead frame 33 which has been subjected to the resin cutting, dam bar cutting and the lead cutting processes at the lead processing basic unit 31 can be removed by one pitch by a suitable removing mechanism, not shown.

It is noted that the product on the removed resin sealed lead frame 33 is generally cut and separated by the next step and, subsequently, a lead bending process for the outer lead 132 is performed. As will later be described, the cutting and separating step for each product may be performed by a product cutting and separating portion on the resin sealed lead frame at the removing portion 32 or between lead processing basic unit 31 and the removing portion 32.

Further, a structure for automatically aligning the separated works and transporting them to the next step may be employed.

Now, referring to FIG. 5B, another lead processing basic unit 310 has been added to the basic unit 31. Both units function in the same way. The respective processing apparatus shown in FIG. 5A will now be described.

The combined structure of the lead processing portion with the lead processing basic unit 310 added includes: a feeding portion 30 for the resin sealed lead frame positioned upstream of the lead processing which is the same as the above for the basic structure; a lead processing basic unit 31 for the resin sealed lead frame; and a removing portion 32 for the resin sealed lead frame downstream of the unit 310. The additional lead processing basic unit 310 functions in the same way as that of lead processing basic unit 31. The unit 310 is detachably added between the lead processing basic unit 31 and the removing portion 32. Detaching means are not shown.

Similarly, the additional lead processing basic unit 310 comprises: a punch and die A2 for resin cutting which is of the same type as that for the lead processing basic unit 31; a punch and die for the dam bar cutter 32; and a punch and die for the lead cutter C2.

It is noted that in the above described structure, at least the lead processing basic unit 31, the additional lead processing basic unit 310 to be added and the product removing portion 32 need to be detachably connected by suitable simple detaching means. However, each portion, namely the feeding portion 30, the lead processing basic units 31, 310 and the removing portion 32, is formed as a module, so that a structure with detachably connected modules is obtained.

The steps and functions in the above described basic structure of the processing apparatus will now be described with reference to FIGS. 7A and 7B.

The basic structure is constructed similarly to that of the conventional lead processing apparatus, so that the resin sealed lead frame may be sequentially fed by one pitch along the feeding path and pressed by molds for cutting which are spaced by one pitch. More specifically, as shown in FIG. 7B(*a*), the resin sealed lead frame 33 is fed to a lead processing basic unit 31 by one pitch, whereby a first product portion 33*a* is advanced by a feeding mechanism for a resin cutting step A1 at the dam bar 131 by a punch and die that performs the resin cutting step A1.

Figure 7A:
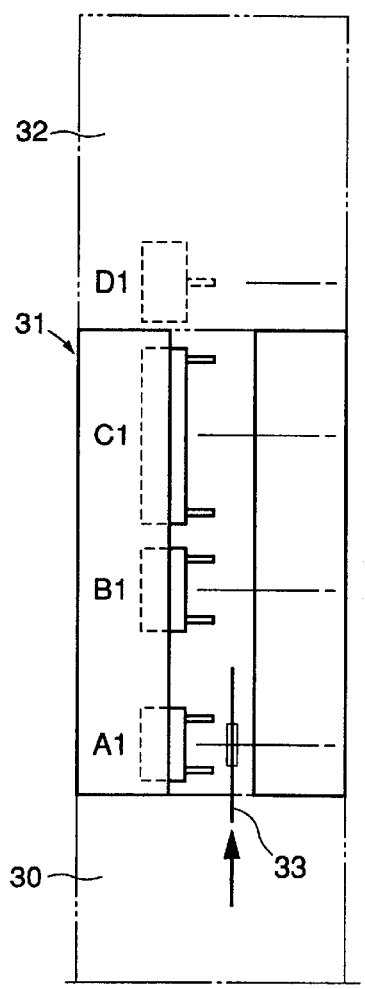
FIGS. 7A and 7B are diagrams showing steps for performing the function of the basic structure of the lead processing apparatus corresponding to FIG. 5A.
Figure 7B:
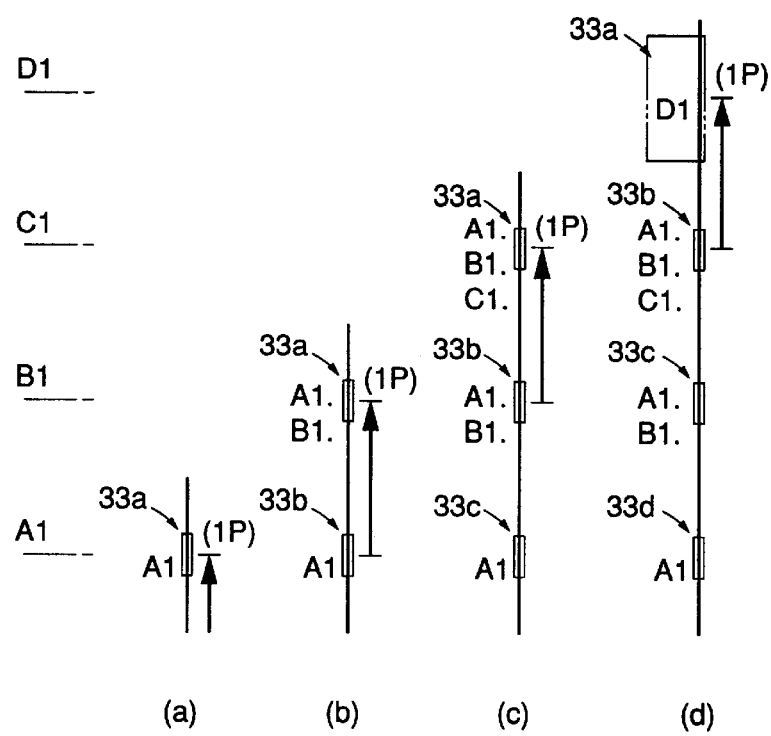

Then, as shown in FIG. 7B(*b*), the resin sealed lead frame 33 is further stepped by one pitch of portion 33*a* for performing a dam bar cutting step B1 by a respective punch and die. At the time when the first portion 33*a* is subjected to the resin cutting step A1 and to the dam bar cutting step B1, the following second pitch portion 33*b* is subjected to a similar resin cutting step A1 as seen in FIG. 7B(*b*).

As shown in FIG. 7B(*c*), the resin sealed lead frame 33, after the resin cutting step A1 and the dam bar cutting step B1 are completed, is further stepped by one pitch for performing a lead cutting step C1 for cutting a tip connecting portion of the outer lead 132 by a punch and die for the lead cutting C1. At the time when the first portion 33*a* is subjected to the resin cutting step A1, the dam bar cutting step B1 and the lead cutting step C1, the following second portion 33*b* is subjected to a resin cutting step A1 and to a dam bar cutting step B1 while the following third portion 33*c* is subjected to a resin cutting step A1.

Then, as shown in FIG. 7B(*d*), the resin sealed lead frame 33, after completion of the resin cutting step A1, the dam bar cutting step B1 and the lead cutting step C1, is further stepped by one pitch, so that it is removed from the removing portion 32. At that time, the second pitch portion 33*b* is subjected to the resin cutting step A1, the dam bar cutting step B1 and lead cutting step C1 as described above. The following third portion 33*c* is subjected to the resin cutting step A1 and to the dam bar cutting step B1 while the following fourth portion 33*d* is subjected to the resin cutting step A1.

It is noted that the cutting and separating step D1 for each product can be successively performed by providing a work cutting and separating portion D1 on the above described resin sealed lead frame at the removing portion 32, or between the lead processing basic unit 31 and the removing portion 32 as indicated by a dotted line in FIG. 7A. In this case, only the cradle 133 which has been subjected to the above described steps needs to be removed.

Further, the products, see the first portion 33*a* shown in FIG. 7B(*d*) after completion of product cutting and separating step D1 may be automatically aligned and transported to the next step.

Now, the steps and functions for the structure to which another lead processing portion having a function substantially the same as that of the lead processing portion is added will be described with reference to FIGS. 8A and 8B.

It is noted that the steps and functions of the combined structure are different compared to those steps of the above described basic structure in that the lead processing basic unit 31 and the removing portion 32 are detachably connected and another lead processing added unit 310 is provided with a function which is the same as that of the lead processing basic unit 31. The added unit 310 is detachably positioned between the lead processing basic unit 31 and the removing portion 32. Therefore, a lead processing apparatus having only one or at least two lead processing units can be selected and employed as required.

If the lead processing apparatus having two lead processing units 31 and 310 is selected and employed, the resin sealed lead frame 33 is sequentially fed by two pitches to double the production volume.

When such a structure is employed, as compared with the case where two lead processing apparatuses of the same kind having full functions are provided, an overall reduction in equipment costs and space requirements for the lead processing apparatus are achieved.

Figure 8A:
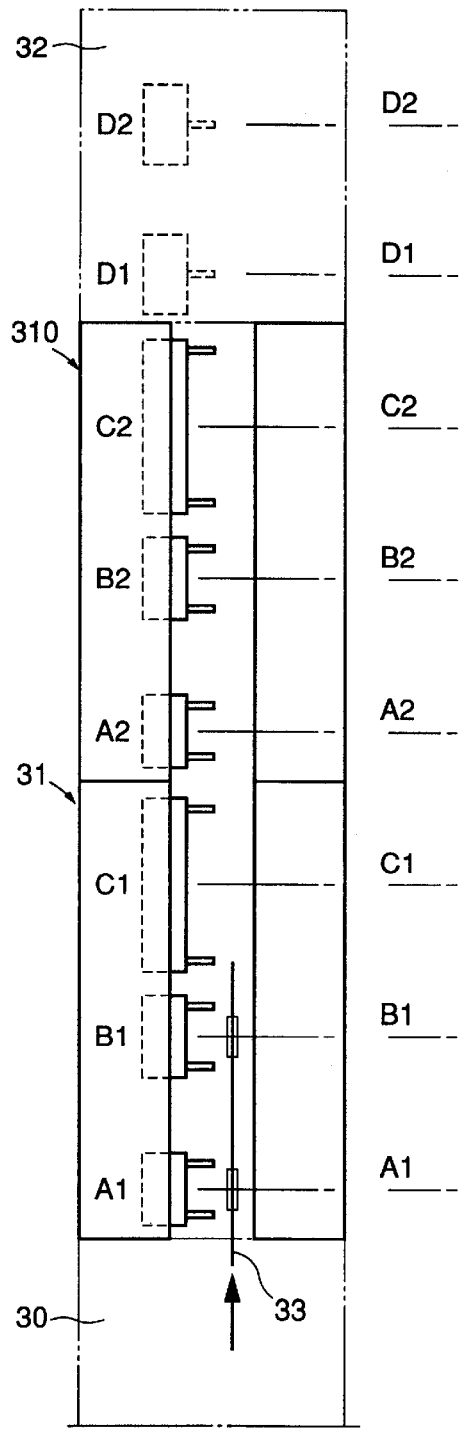
FIGS. 8A and 8B are diagrams showing steps for performing the function of the structure of the lead processing apparatus of FIG. 5B to which another lead processing portion is added.
Figure 8B:
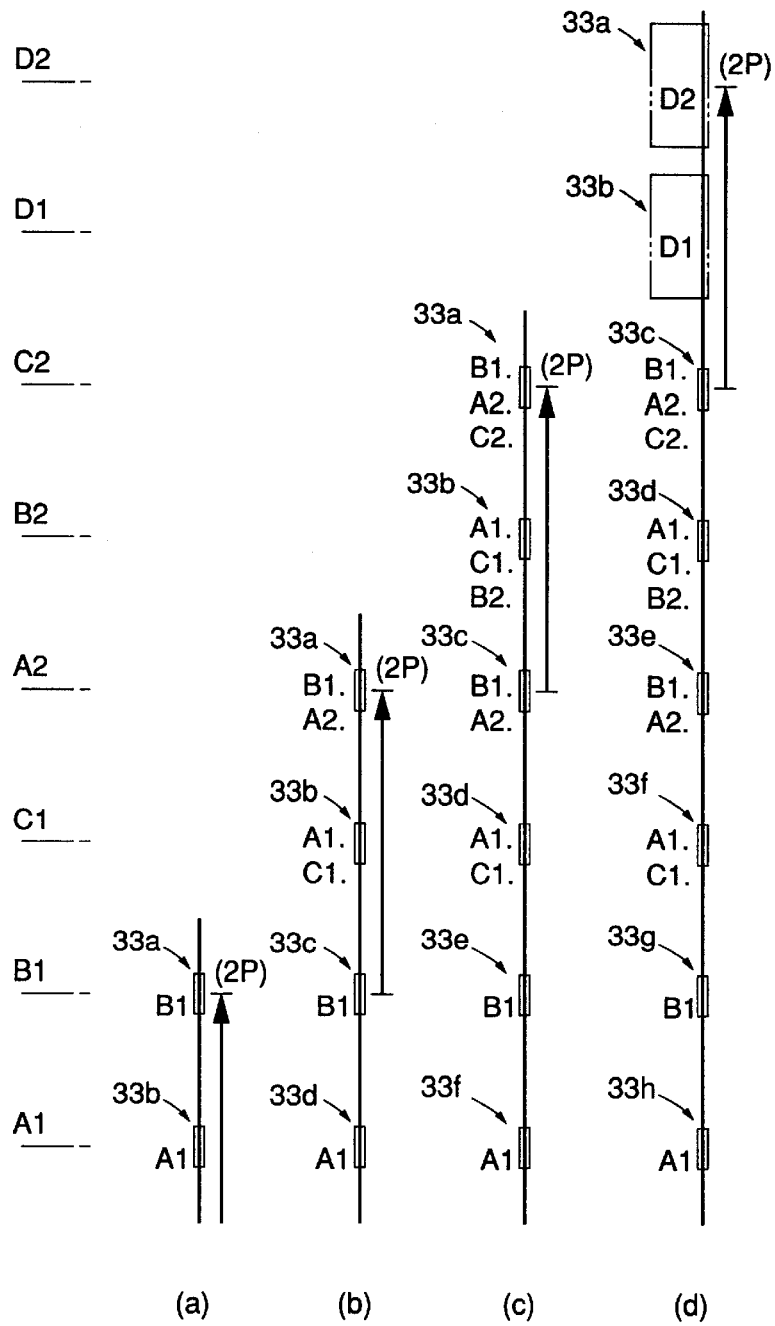

As shown in FIG. 8B(*a*), the resin sealed lead frame 33 is first fed by two pitch portions 33*d* and 33*b* by the feeding mechanism of the feeding portion 30 of the lead processing basic unit 31. The first pitch portion 33*a* is subjected to a dam bar cutting step B1 for cutting the dam bar 131 and the second pitch portion 33*b* is subjected to a resin cutting step A1 for the dam bar 131 by a punch and die for the resin cutting A1 and a punch and die for the dam bar cutting B1 of the lead processing basic unit 31.

As shown in FIG. 8B(*b*), first and second product portions 33*a* and 33*b* after the above described steps are further fed by two pitches. The first product portion 13*a* is subjected to a resin cutting step A2 by a punch and die for the resin cutting step A2 of another lead processing basic unit 310, and the second product portion 33*b* is subjected to the lead cutting step C1 by a punch and die for the lead cutting C1 in lead processing basic unit 31. At that time, the first portion 33*a* is subjected to a dam bar cutting step B1 and a resin cutting step A2, and the second portion 33*b* is subjected to a resin cutting step A1 and a lead cutting step C1. Further, the following third product portion 33*c* is subjected to dam bar cutting step B1, and still following fourth portion 13*d* is subjected to a resin cutting step A1.

Then, as shown in FIG. 8B(*c*), the first and second product portions 33*a* and 33*b*, following the above described steps, are further stepped by two pitches. The first portion 13*a* is subjected to a lead cuttings step C2 by a punch and die for the lead cutting C2 in the lead processing basic unit 310, and the second portion 38*b* is subjected to a dam bar cutting step B2 by a punch and die for the dam bar cutting B2 of the lead processing basic unit 310.

At that time, the first portion 33*a* is subjected to a dam bar cutting step B1, a resin cutting step A2 and the lead cutting step C2, while the second portion 33*b* is subjected to a resin cutting step A1, a lead cutting step C1 and a dam bar cutting step B2. The following third portion 33*c* is subjected to a dam bar cutting step B1 and a resin cutting step A2, while a fourth portion 33*d* is subjected to a resin cutting step A1 and to a lead cutting step C1. The still following fifth portion 33*e* is subjected to a dam bar cutting step B1 and a sixth portion 33*f* is subjected to a resin cutting step A1.

As shown in FIG. 8B(*c*), the first portion 33*a*, after the dam bar cutting step B1, the resin cutting step A2 and the lead cutting step C2, and the second portion 33*b*, after the resin cutting step A1, the lead cutting step C1 and the dam bar cutting step B2, are further fed by two pitches and then removed from the removing portion 32. Therefore, at that time, the third portion 33*c* is subjected to the dam bar cutting step B1, the resin cutting step A2 and the lead cutting step C2 as shown in FIG. 8B(*d*). The fourth portion 33*d* is subjected to the resin cutting step A1, the lead cutting step C1 and the dam bar cutting step B2. The fifth portion 33*e* is subjected to the dam bar cutting step B1 and to the resin cutting step A2. A sixth portion 33*f* is subjected to the resin cutting step A1 and the lead cutting step C1. Further, the following seventh portion 33*g* is subjected to the dam bar cutting step B1. The eighth portion 33*h* is subjected to the resin cutting step A1.

It is noted that two work cutting and separating machine sections D1, D2 corresponding to two pitches of transportation, are provided at the removing portion 32, or between the lead processing basic unit 310 and the removing portion 32 as indicated by a dotted line in FIG. 8A, so that the cutting and separating steps D1, D2 can be performed sequentially after the above described steps have been completed. In this case, only the cradle 133 which has been subjected to the above described steps, needs to be removed.

The products, see first and second portions 13a and 13b shown in FIG. 8B(d) after the lead cutting and the separating steps D1, D2 may be automatically aligned and transported to the next step.

As described above, in the structure in which the additional lead processing basic unit 310 performing the same function as the lead processing basic unit 31 is added to the basic structure of the aforementioned processing apparatus, the added unit is inserted between the lead processing basic unit 31 and the removing portion 32. All units or at least the basic unit is detachably connected. Therefore, the lead processing apparatus may be structured to have only one lead processing basic unit as shown in FIG. 5A, or two lead processing basic units 31, 110 as shown in FIG. 5B.

In addition, at least the lead processing basic unit 31 and additional lead processing basic unit 310 or removing portion 32 is detachably connected in a module, whereby the number of the lead processing portions can suitably be changed as necessary.

When the lead processing apparatus provided with two lead processing basic units 31 and 310 is used, the production volume is doubled. Moreover, in the enlarged structure, the feeding portion 30 and the removing portion 32 may be the same as in the apparatus with only one basic unit. Therefore, as compared with the case where two lead processing apparatuses of the same kind having full functions are provided, overall reduction in equipment cost and space for the lead processing apparatus can be advantageously achieved.

The present invention is not limited to the above described embodiments, and various modifications can be made without departing from the scope of the invention.

Figure 9A:
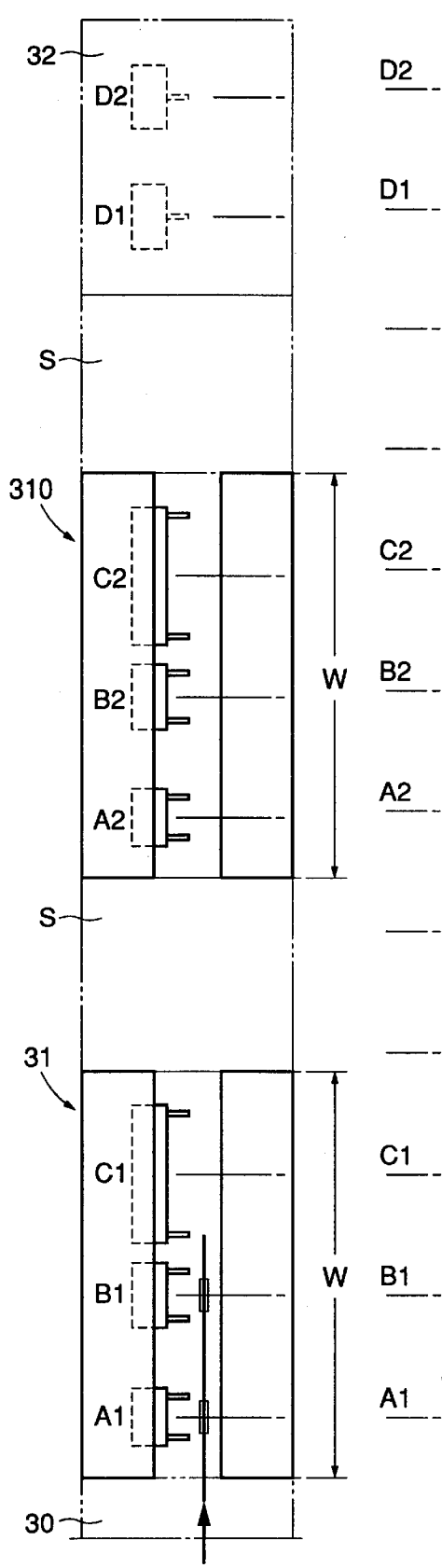
FIG. 9A is a schematic diagram generally showing a lead processing apparatus according to a fourth embodiment of the present invention.

For example, lead processing may be performed for resin sealed lead frames having different pitches as shown in FIG. 9A, because of the shape, width W or the like of the above mentioned lead processing portion.

In this case, however, the following adjustment of the pitches enables the above described lead processing.

More specifically, a required space S (corresponding to two pitches) is provided between the two lead processing basic units 31 and 310 as well as between the lead processing basic unit 310 and the removing portion 32.

Figure 9B:
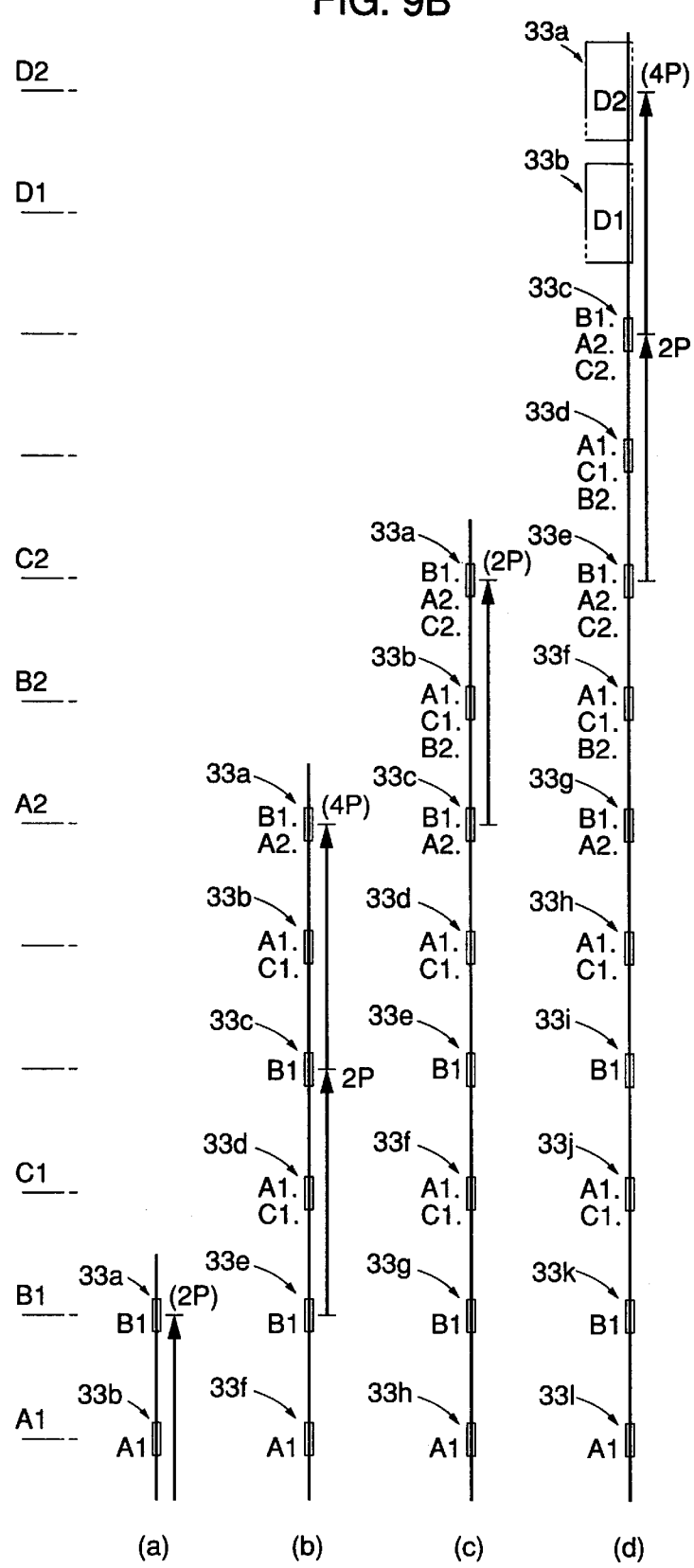
FIG. 9B is a diagram showing the steps and respective function thereof.
Figure 11:
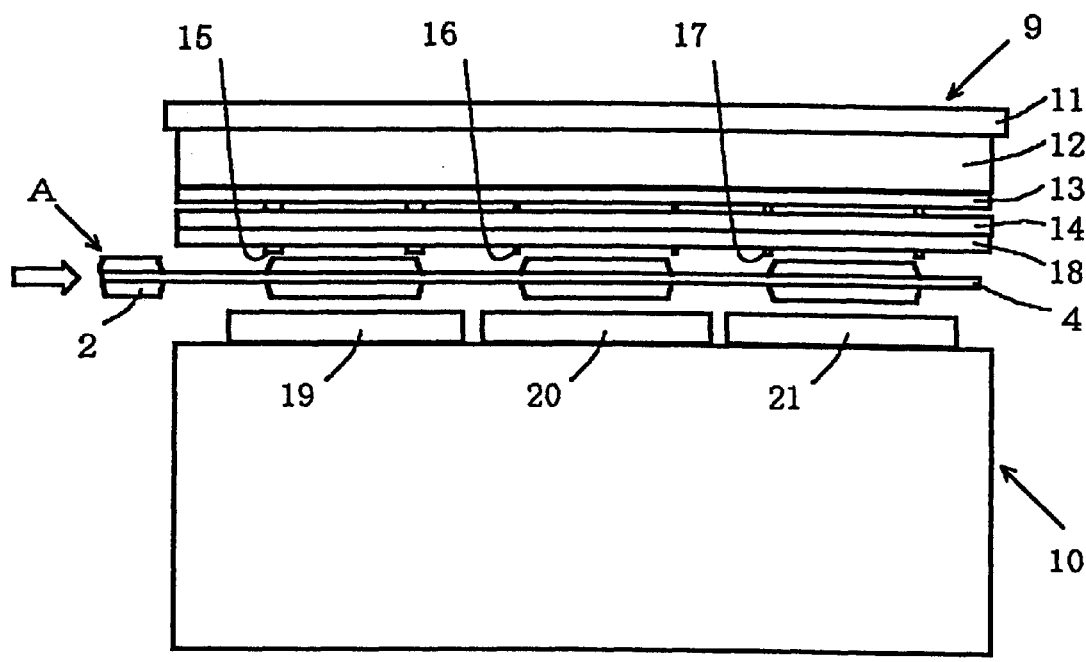
FIG. 11 is a front view generally showing an overall structure of a processing apparatus for a resin sealed lead frame according to the first type of prior art.

In the space S, a lead processing step is not performed. Thus, to perform processing by another lead processing basic unit 310 after processing by the lead processing basic unit 31, the resin sealed lead frame may be fed by four pitches, see the first portion 33a shown in FIGS. 9B(b) and (d). Further, for feeding from the additional lead processing basic unit 310 to the removing portion 32 or from the additional lead processing basic unit 310 to the work cutting and separating portions (D1, D2), the resin sealed lead frame may be similarly advanced by four pitches.

Despite the above mentioned functional difference, the structure shown in FIG. 9A is similar to the structures of the first and second embodiments in the feeding step for sequentially feeding the resin sealed frame by two pitches, in the lead processing step for performing a prescribed lead processing for the portions spaced by two pitches, and in the removing step. Therefore, the structure shown in FIG. 9A, can provide substantially the same effect as that of the above described embodiments.

In the embodiment shown in FIG. 9A, the feeding step for sequentially feeding the resin sealed lead frame by two pitches, the lead processing step for performing a prescribed lead processing for portions spaced by two pitches and the removing step are performed. The number of pitches by which the resin sealed lead frame is fed is at least two.

Now, referring to FIGS. 10A and 10B, the resin sealed lead frame will be described as being sequentially fed by three pitches.

FIG. 10A shows a structure in which three lead processing basic units 31, 310 and 311 are positioned along a feeding path of the resin sealed lead frame, a space S corresponding to a required pitch is provided between the lead processing basic unit 311 and the removing portion 321. The removing portion 321 includes three work cutting and separating stations D1, D2, D3.

As shown in FIGS. 10B(a) to (f), despite the functional difference in the feeding step for sequentially feeding the resin sealed lead frame by three pitches, the lead processing step for performing a prescribed lead processing for portions spaced by three pitches, the work cutting and separating step and the removing step for removing the resin sealed lead frame, substantially the same function and effect can be obtained by sequentially feeding the resin sealed lead frame by a plurality of pitches for performing a prescribed lead processing for the portions spaced by the plurality of pitches.

In each of the embodiments shown in FIGS. 9A and 10A, a mechanism for inspecting the state of lead processing or the like can suitably be arranged at the portions spaced by at least two pitches, while making use of the space S.

Although the present invention has been described and illustrated in detail, it is to be understood that the same is by way of illustration and example only and is not to be taken by way of limitation, the spirit and scope of the present invention being limited only by the terms of the appended claims.

What is claimed is:

1. A method for processing resin sealed lead frames by performing a first number N of processing operations on said resin sealed lead frames, said method comprising the following steps:

(a) preparing said resin sealed lead frames with products (2) on said resin sealed lead frames (4) having a spacing corresponding to a first pitch (P) defined as an on-center distance between neighboring products (2) on said resin sealed lead frames (4), (b) assembling a second number n of processing tool modules (100, 101, . . . ) for each of said first number N of processing operations, in series along a processing feed advance path, so that a total number M of processing tool modules corresponds to M=N·n for performing said operations on said resin sealed lead frames, and (c) sequentially feeding said resin sealed lead frames with said products on said resin sealed lead frames (4) along said processing feed advance path in steps having a step length corresponding to a second pitch (P') that is equal in length to said second number n times said first pitch (P), thus P'=n·P, and wherein said second number n is at least equal to two for simultaneously processing at least two of said products on said resin sealed lead frames.

2. The method of claim 1, wherein said step of assembling comprises positioning in sequence along said feed advance path two cavity cutter modules forming a pair, two resin cutter modules forming a pair, two dam bar cutter modules forming a pair and two pinch lead cutter modules also forming a pair, when said second number n equals two.

3. The method of claim 1, further comprising performing a feed-in step (30) for supplying not yet processed lead frames to said processing tool modules prior to said sequentially feeding steps.

4. The method of claim 1, further comprising performing a receiving step (32) for discharging processed lead frames following said sequential feeding and processing steps.

5. The method of claim 1, wherein said step of assembling comprises assembling at least two basic units (31, 310) of said processing tool modules and arranging said at least two basic units in series with each other between a feed-in unit (30) for performing a feed-in step and a receiving unit (32) for performing a removing step.

6. The method of claim 5, further comprising performing a lead-cutting step prior to said removing step for separating products from each other on said lead frame body.

7. The method of claim 5, further comprising the step of providing a space (S) between said at least two basic units and a further space (S) between said receiving unit (32) and said at least two basic units (31, 310), and further selecting for said spaces (S) a length corresponding to less than or equal to said second number n times the length of said first pitch (P).

8. The method of claim 5, wherein said operations comprise performing at least a resin cutting step, a dam bar cutting step and a lead cutting step in each of said at least two basic units.

* * * * *